United States Patent
Degen et al.

(10) Patent No.: US 9,444,183 B2
(45) Date of Patent: Sep. 13, 2016

(54) BUSED ELECTRICAL CENTER FOR ELECTRIC OR HYBRID ELECTRIC VEHICLE

(71) Applicants: Yazaki North America, Inc., Canton, MI (US); Yazaki Corporation, Tokyo (JP)

(72) Inventors: Jason R. Degen, Plymouth, MI (US); Tomohiro Ikeda, Tokyo (JP)

(73) Assignees: Yazaki North America, Inc., Canton, MI (US); Yazaki Corporation, Tokyo (JP)

(*) Notice: Subject to any disclaimer, the term of this patent is extended or adjusted under 35 U.S.C. 154(b) by 66 days.

(21) Appl. No.: 14/601,654

(22) Filed: Jan. 21, 2015

(65) Prior Publication Data

US 2015/0229071 A1  Aug. 13, 2015

Related U.S. Application Data

(60) Provisional application No. 61/937,664, filed on Feb. 10, 2014.

(51) Int. Cl.
*H01R 13/627* (2006.01)
*H05K 7/02* (2006.01)
(Continued)

(52) U.S. Cl.
CPC .......... *H01R 13/627* (2013.01); *H01R 13/506* (2013.01); *H05K 7/026* (2013.01);
(Continued)

(58) Field of Classification Search
CPC  H01R 13/627; H01R 13/506; H01R 13/114; H01R 13/6625; H01R 13/7195; H01R 13/719; H01R 23/7073; H01R 12/58; B60R 16/0238; H05K 7/026; H05K 3/308; H05K 7/20845–7/20881; Y10T 29/49169
USPC ................ 439/76.2, 620.09, 620.12, 620.24, 439/620.25; 361/600–678
See application file for complete search history.

(56) References Cited

U.S. PATENT DOCUMENTS 6,219,245 B1  4/2001 Nagashima et al.
6,824,630 B2  11/2004 Oishi et al.
(Continued)

FOREIGN PATENT DOCUMENTS

EP  0286031 A2  10/1988
JP  H0992348 A  4/1997
(Continued)

OTHER PUBLICATIONS

Japanese Office Action issued on Sep. 29, 2015, for Japanese Patent Application No. 2014-231304. Translation provided by Marks & Clerk Singapore LLP.
(Continued)

*Primary Examiner* — Zachary M Pape
(74) *Attorney, Agent, or Firm* — Harness, Dickey & Pierce, P.L.C.

(57) ABSTRACT

A bused electrical center and a method for its construction. The bused electrical center includes a plurality of bus bars, which are housed between a bus bar housing and a filter housing, a filter device and a plurality of interface terminals that couple leads on the filter device to isolation tabs formed on the bus bars. No solder is employed to electrically or mechanically couple the interface terminals to the leads or to the isolation tabs such that the interface terminals are the sole means for electrically connecting the isolation tabs and the leads.

18 Claims, 4 Drawing Sheets

(51) Int. Cl.
*H01R 13/506* (2006.01)
*B60R 16/023* (2006.01)
*H01R 13/11* (2006.01)
*H01R 13/66* (2006.01)

(52) U.S. Cl.
CPC .......... *B60R16/0238* (2013.01); *H01R 13/114* (2013.01); *H01R 13/6625* (2013.01); *Y10T 29/49169* (2015.01)

(56) References Cited

U.S. PATENT DOCUMENTS

| | | | | |
|---|---|---|---|---|
| 6,932,625 | B2 * | 8/2005 | Yagi | H01R 31/08 439/76.2 |
| 7,381,065 | B2 * | 6/2008 | Ikeda | H05K 7/026 439/76.2 |
| 7,683,254 | B2 | 3/2010 | Shimizu | |
| 8,023,272 | B2 | 9/2011 | Shimizu | |
| 8,690,588 | B2 | 4/2014 | Jetton et al. | |
| 8,692,418 | B2 | 4/2014 | Ikeda et al. | |
| 8,765,289 | B2 | 7/2014 | Ikeda et al. | |
| 8,816,538 | B2 * | 8/2014 | Ikeda | B60R 16/0238 307/150 |
| 8,822,062 | B2 | 9/2014 | Ikeda et al. | |
| 8,973,879 | B2 | 3/2015 | Kodama et al. | |
| 9,306,381 | B2 | 4/2016 | Lumetta et al. | |
| 2006/0234527 | A1 * | 10/2006 | Yagi | H01R 11/01 439/76.2 |
| 2012/0064740 | A1 | 3/2012 | Kawaguchi | |
| 2012/0244759 | A1 | 9/2012 | Tsuji | |
| 2013/0241493 | A1 | 9/2013 | Kosaki et al. | |
| 2015/0229080 | A1 | 8/2015 | Degen | |

FOREIGN PATENT DOCUMENTS

| | | |
|---|---|---|
| JP | 2001319701 A | 11/2001 |
| JP | 2009/111832 A | 5/2009 |
| JP | 2012059658 A | 3/2012 |
| JP | 2012204109 A | 10/2012 |
| JP | 2014-121194 A | 6/2014 |
| WO | 2010/025223 A2 | 3/2010 |

OTHER PUBLICATIONS

European Search Report issued on Oct. 21, 2015, regarding European Patent Application No. EP 15 15 4268.

First Office Action (Notification of Reasons for Refusal) regarding Japanese Patent Application No. 2015-023360, mailed Feb. 2, 2016. Translation provided by Harakenzo World Patent & Trademark.

* cited by examiner

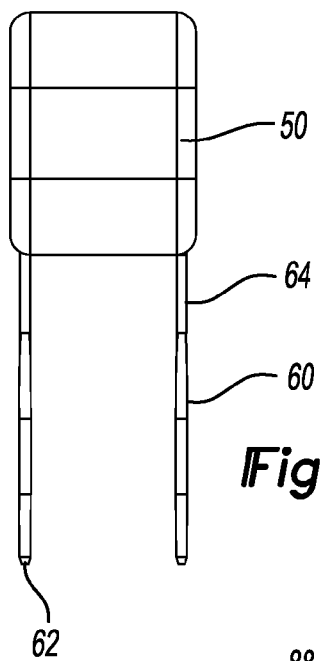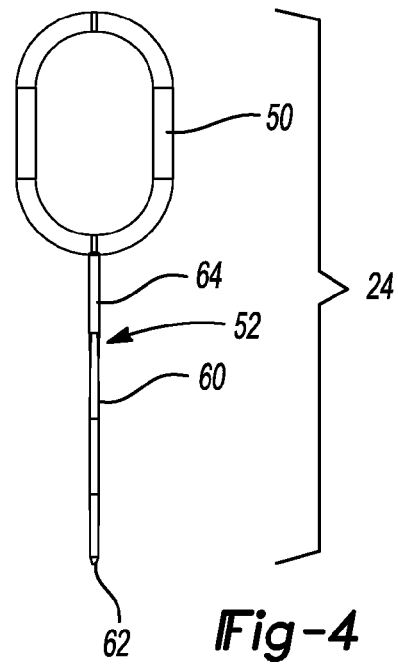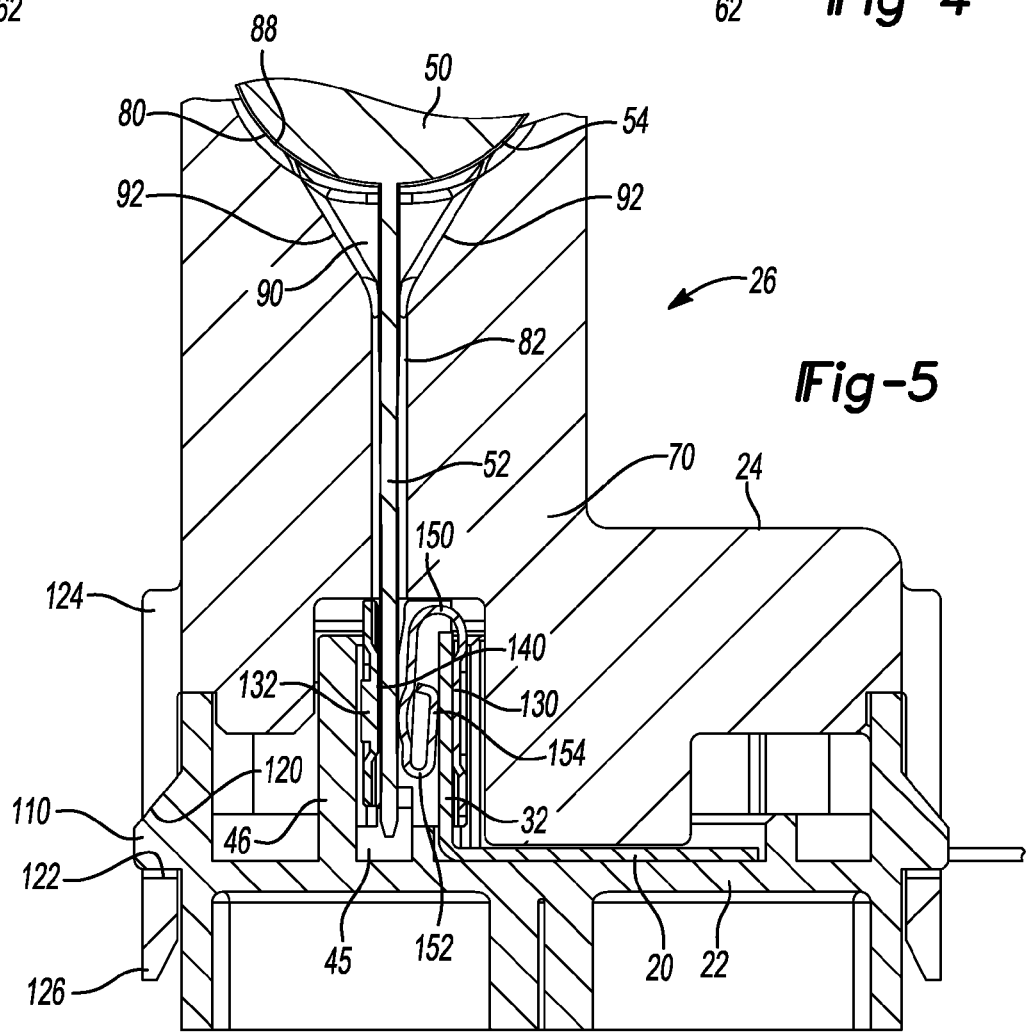

BUSED ELECTRICAL CENTER FOR ELECTRIC OR HYBRID ELECTRIC VEHICLE

CROSS-REFERENCE TO RELATED APPLICATIONS

This application claims the benefit of U.S. Provisional Application No. 61/937,664, filed on Feb. 10, 2014. The entire disclosure of the above application is incorporated herein by reference.

FIELD

The present disclosure relates to a bused electrical center for an electric or hybrid electric vehicle.

BACKGROUND

This section provides background information related to the present disclosure which is not necessarily prior art.

Bused electrical centers for various electric and hybrid electric vehicles can include electric filters for filtering switching noise that is created by a power inverter and transmitted over the electric bus. One electric filter currently manufactured by the assignee of the present application includes a plurality of capacitors having leads that are pre-set over an insulation displacement connection (IDC) terminal, the leads are then press-fit into the IDC terminals and the leads are manually soldered to the IDC terminals. While effective, the assembly and electrical connection process is labor intensive and is associated with significantly long cycle times. Accordingly, an improved bused electrical center is needed in the art.

SUMMARY

This section provides a general summary of the disclosure, and is not a comprehensive disclosure of its full scope or all of its features.

In one form, the present teachings provide a bused electrical center that includes a pair of bus bars, a bus bar housing, a filter housing, a filter and a plurality of interface terminals.

Each of the bus bars has an isolation tab. The bus bar housing has a first housing body, a plurality of first rails and a plurality of alignment bosses. The first rails extend from the first housing body. Each of the alignment bosses is coupled to the first housing body and is disposed between a corresponding pair of the first rails. The bus bars are mounted on the bus bar housing such that each of the isolation tabs is disposed between an associated pair of the first rails. The filter housing has a second housing body, a plurality of second rails, and a plurality of guides. The second housing body defines a filter cavity and a pair of lead apertures. The second rails are coupled to the second housing body and are disposed parallel to the lead apertures. Each of the lead apertures extends through an associated one of the guides. The second housing body is coupled to the first housing body such that the second rails engage the first rails. The filter device has a capacitor and a pair of leads that are electrically coupled to the capacitor. The capacitor is at least partly received in the filter cavity. Each of the leads being received through an associated one of the lead apertures, an associated one of the guides and into an associated one of the alignment bosses. Each of the interface terminals is received between a pair of the first rails and has a bus bar contact, which is electrically engaged to a corresponding one of the isolation tabs, and a lead contact that is electrically engaged to a corresponding one of the leads. No solder is employed to electrically or mechanically couple the interface terminals to the leads or to the isolation tabs such that the interface terminals are the sole means for electrically connecting the isolation tabs and the leads.

In another form, the present teachings provide a method for forming a bused electrical center. The method includes: providing a capacitor with a pair of leads; assembling a plurality of bus bars to a bus bar housing, each of the bus bars having an isolation tab that extends into a pocket that is defined by a pair of first rails and an end wall that interconnects the pair of first rails; installing an interface terminal to each of the isolation tabs, each interface terminal being received in an associated one of the pockets; installing a filter housing to the bus bar housing; and installing the capacitor to the filter housing such that each of the leads of the capacitor extends through the filter housing and an associated one of the interface terminals and into the bus bar housing to thereby couple each of the leads to the associated one of the interface terminals and a corresponding one of the isolation tabs.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 3 and 4 are front and side views, respectively, of a portion of the electrical center of FIG. 1, illustrating a filtering device in more detail;

FIG. 5 is a section view taken along the line 5-5 of FIG. 1; and

Corresponding reference numerals indicate corresponding parts throughout the several views of the drawings.

DETAILED DESCRIPTION

Figure 1:
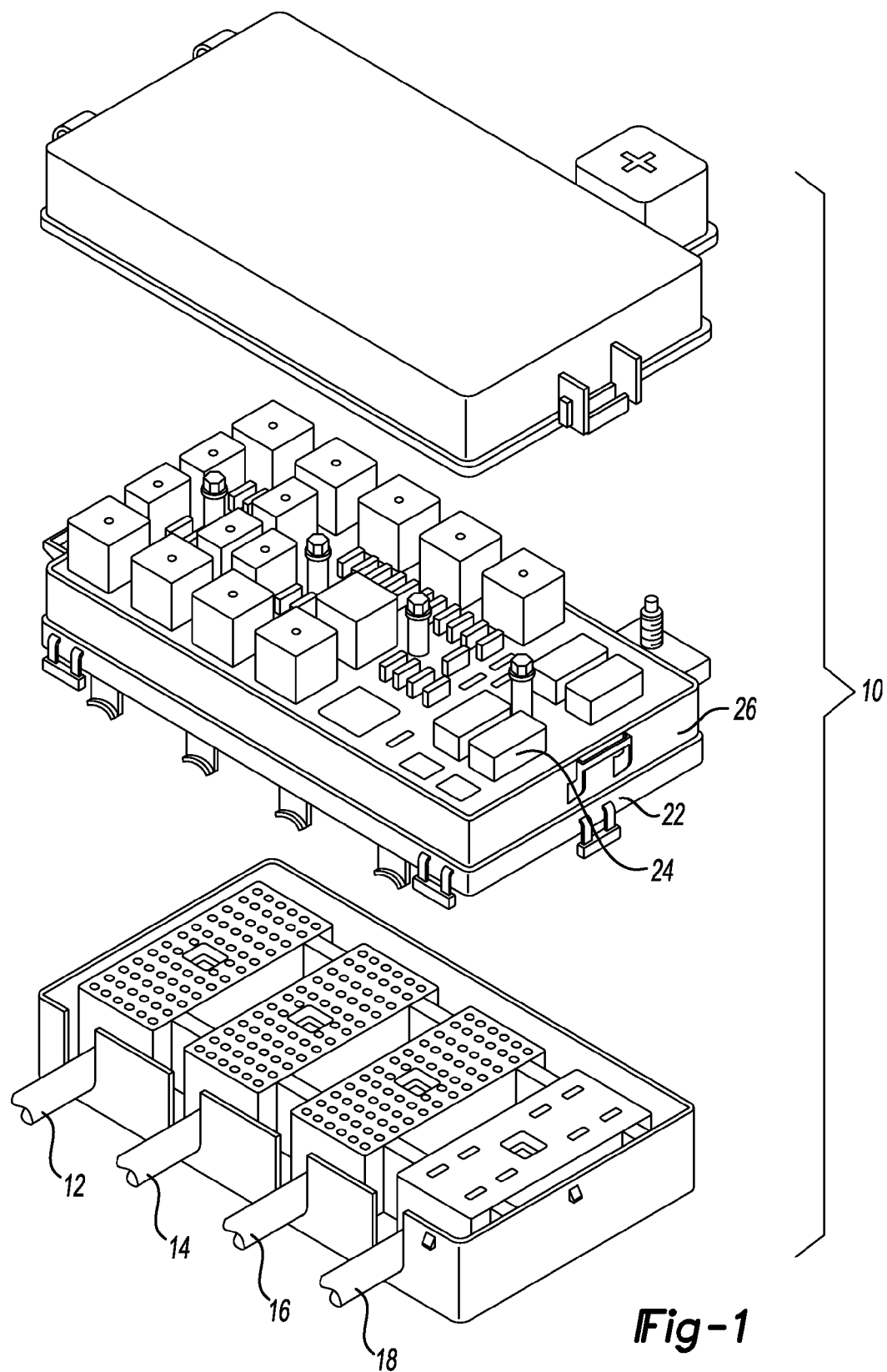
FIG. 1 is an exploded perspective view of an electrical center constructed in accordance with the teachings of the present disclosure.

With reference to FIG. 1, a bused electrical center (BEC) constructed in accordance with the teachings of the present disclosure is generally indicated by reference numeral 10. Except as described herein, the BEC 10 is generally conventional in its construction insofar as it houses a plurality of bus bars for supplying relatively high-current power to various circuits and conductors (e.g., wire harness 12, 14, 16, 18) in a modern automotive vehicle, such as a full hybrid electric vehicle (FHEV) or a plug-in hybrid electric vehicle (PHEV).

Figure 2:
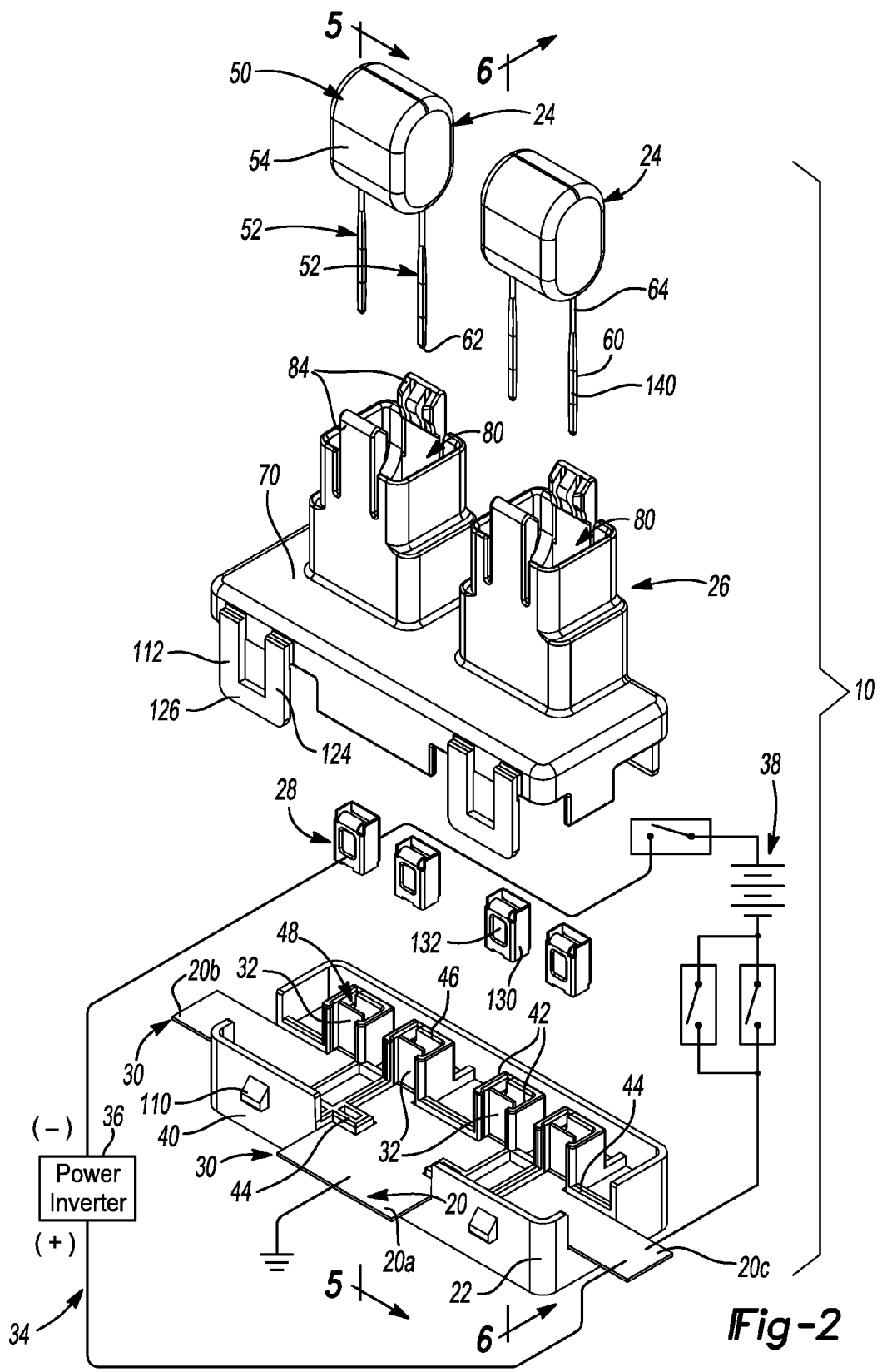
FIG. 2 is an exploded perspective view of a portion of the electrical center of FIG. 1.

With reference to FIG. 2, the BEC 10 can include a plurality of bus bars 20, a bus bar housing 22, one or more filter devices 24, a filter housing 26 and a plurality of interface terminals 28.

Each of the bus bars 20 can be formed of an electrically conductive material, such as copper, and can be sized to transmit relatively high-current DC electric power. Each bus bar 20 can have a bus bar body 30 and one or more isolation tabs 32. In the particular example provided, the bus bars 20 are formed copper sheet and each isolation tab 32 is disposed generally perpendicular to its associated bus bar body 30. A first one of the bus bars 20a can be configured to be coupled to a vehicle electric system 34 that can include a power inverter 36 and a battery 38. Each of the other bus bars, such as bus bars 20b and 20c, can be coupled to the bus bar 20a via one of the filter devices 24.

Figure 6:
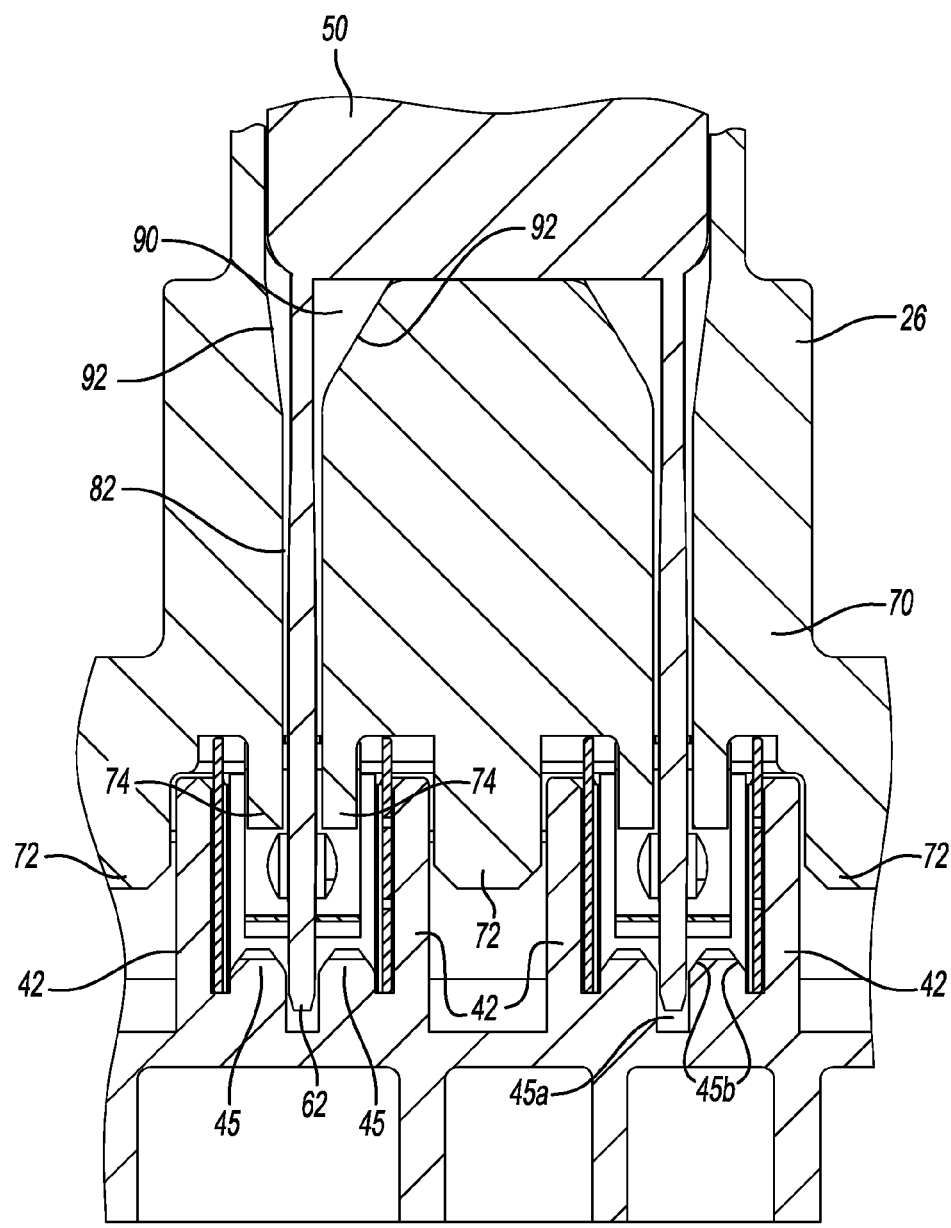
FIG. 6 is a section view taken along the line 6-6 of FIG. 1.

With reference to FIGS. 2, 5 and 6, the bus bar housing 22 can include a first housing body 40, a plurality of first rails 42, a plurality of bus bar bosses 44 and a plurality of alignment bosses 45. The bus bar housing 22 is configured to at least partly house the bus bars 20 and in the example provided, the first housing body 40 is configured with structures, such as ribs and posts that are configured to interlock with the bus bars 20 such that the bus bars 20 nest into the first housing body 40. The first rails 42 can be coupled to and extend from the first housing body 40. Each of the isolation tabs 32 can be received between a pair of the first rails 42 and each pair of the first rails 42 can be interconnected by an end wall 46. The end wall and its associated first rails 42 can define a pocket 48. Each of the bus bar bosses 44 can be coupled to the first housing body 40 can be disposed in an associated pocket 48 between a pair of the first rails 42. Each of the alignment bosses 45 can extend from the first housing body 40 and can define a lead recess 45a. One or more edges 45b of the alignment bosses 45 can be chamfered.

Each filter device 24 can comprise any means for electrically connecting the bus bar 20a to another one of the bus bars, such as bus bar 20b or 20c and for suppressing or canceling electrical "noise" that is received by the bus bar 20a (from the vehicle electric system 34) to thereby inhibit or reduce the transmission of the electrical "noise" to another one of the bus bars 20b, 20c. In the particular example provided, each filter device 24 comprises a capacitor 50 and a pair of leads 52. The capacitor 50 is conventional in its construction and operation and has an outer surface 54. The leads 52 can be formed of an electrically conductive wire material and are electrically coupled to the capacitor 50 in a conventional and well known manner. Optionally, the leads 52 can be deformed to provide additional work hardening to a desired area and/or to change the cross-sectional area or surface area of a desired portion of the leads 52.

In the particular example provided and with additional reference to FIGS. 3 and 4, the leads 52 comprise a deformed portion 60 that is deformed in a coining operation to provide additional work hardening of the deformed portion 60 (i.e., to provide added strength to the deformed portion 60), to change the cross-sectional area of wire that forms the deformed portion 60, and to provide the lead 52 with an insertion portion 62. The cross-sectional area of the wire can be changed in any desired manner, such as from round wire to a wire having a rectangular or square shape. For example, the leads 52 can be initially formed of round wire having a nominal diameter of 1.0 mm and can be subsequently deformed such that the deformed portion 60 can have a rectangular cross-section having a length of 1.10 mm and a width of 0.80 mm. It will be appreciated that the undeformed portion 64 of the lead 52 can have a first cross-sectional shape and a first cross-sectional area, and that the deformed portion 60 of the lead 52 can have a second, different cross-sectional shape and a second cross-sectional area. It will also be appreciated that the deformed portion 60 of the lead 52 is work hardened to a greater extent that the undeformed portion 64 that directly extends from the capacitor 50. The second cross-sectional area can be larger than the first cross-sectional area in some configurations. The insertion portion 62 can be configured with a tapering configuration and/or with reduced area to reduce the force that is needed to insert the leads 52 through the bus bar housing 22, the interface terminals 28 and into the filter housing 26. In the example provided, the insertion portion 62 of each of the leads 52 has a leading end that is chamfered on four sides.

With reference to FIGS. 2, 5 and 6, the filter housing 26 can have a second housing body 70, a plurality of second rails 72, and a plurality of guides 74. The second housing body 70 can define a filter cavity 80, a pair of lead apertures 82, and a filter device retainer 84. The filter cavity 80 is sized to at least partly receive the capacitor 50 and in the example provided, has a surface 88 that is configured to matingly engage a portion of the outer surface 54 of the capacitor 50. The lead apertures 82 are in communication with the filter cavity 80 and are sized to receive an associated one of the leads 52. In the example provided, the second housing body 70 defines a plurality of entry apertures 90, each of which interconnect an associated one of the lead apertures 82 to the filter cavity 80. In this regard, each entry aperture 90 intersects the filter cavity 80 and an associated one of the lead apertures 82. Each entry aperture 90 can have a plurality of sidewalls 92 that can be tapered in a manner that converges with increasing distance from the filter cavity 80. Accordingly, it will be appreciated that the entry apertures 90 are configured to direct the insertion portion 62 of the leads 52 into the lead apertures 82 in the event that the insertion portions 62 contact one or more of the sidewalls 92. The filter device retainer 84 can comprise a pair of contoured spring arms 100 that can resiliently engage the outer surface 54 of the capacitor 50 and urge the capacitor 50 downwardly against the surface 88 of the filter cavity 80.

The second rails 72 can be coupled to the second housing body 70 and can be disposed parallel to the lead apertures 82. Each of the guides 74 can be received between a pair of the second rails 72 such that the lead apertures 82 extend through the guides 74. The second housing body 70 can be coupled to the first housing body 40 in any desired manner such that the second rails 72 engage the first rails 42. In the example provided, the bus bar housing 22 includes a plurality of first retainers 110 that are coupled to the first housing body 40 and which engage with second retainers 112 that are coupled to the second housing body 70 to fixedly but removably couple the filter housing 26 to the bus bar housing 22. The first and second retainers 110 and 112 can be constructed in any desired manner. For example, one of the first and second retainers 110 and 112 can comprise a protrusion having a ramped surface 120 and an abutting surface 122, and the other one of the first and second retainers 110 and 112 can comprise a generally U-shaped tab 124 having a tab member 126. When the bus bar housing 22 and the filter housing 26 are mated together, contact between the ramped surfaces 120 and the U-shaped tabs 124 can deflect the tab members 126 outwardly so that the tab members 126 can ride over the ramped surfaces 120 and can engage the abutting surfaces 122 when the U-shaped tabs 124 return to an undeflected state.

Each of the interface terminals 28 can be received in an associated one of the pockets 48 between a pair of the first rails 42 and can have a bus bar contact 130, which can be electrically coupled to a corresponding one of the isolation tabs 32, and a lead contact 132 that can be electrically coupled to a corresponding one of the leads 52. Optionally, the bus bar contact 130 could be configured to both mechanically and electrically engage the corresponding one of the isolation tabs 32. For example, the bus bar contact 130 could be configured with a receptacle-type terminal that is configured to mechanically and electrically engage one of the isolation tabs 32. In this regard, the isolation tabs 32 can be male blade terminals that can mechanically and electrically engage a correspondingly configured terminal that is integrated into the bus bar contact 130. In the example shown, however, both the bus bar contact 130 and the lead contact 132 comprise flat, planar surfaces that are abutted against a corresponding one of the isolation tabs 32 and a contact zone 140 formed on at least a part of the deformed portion 60 a corresponding one of the leads 52. It will be appreciated that the contact zone 140 and the lead contact 132 can be shaped such that contact therebetween occurs over a predetermined area.

Each of the interface terminals 28 can optionally include one or more spring arms or contacts that can be biased into contact with one or both of the isolation tabs 32 and the lead 52. For example, a spring contact 150 can extend from the bus bar contact 130 and can include a generally U-shaped nose 152, the end or a side of which can be abutted to a flat surface of the lead 52 on an opposite side of the lead 52 that contacts the lead contact 132, and a generally L-shaped foot 154 that can be engaged to the isolation tab 32. The spring contact 150 can be elastically deformed or compressed between the lead 52 and the isolation tab 32 such that the lead 52 is biased into contact with the lead contact 132 and the isolation tab 32 is biased into contact with the bus bar contact 130. The guides 74 can extend from the second housing body 70 to an extent such that they are received into the interface terminals 28. Accordingly, it will be appreciated that the guides 74 can help position both the interface terminals 28 and the leads 52 relative to the filter housing 26. Similarly, the alignment bosses 45 can extend from the first housing body 40 to an extent such that they are received into the interface terminals. Accordingly, it will be appreciated that the alignment bosses 45 can help to position both the interface terminals 28 and the leads 52 relative to the bus bar housing 22.

Assembly of the BEC 10 is relatively quick and involves less labor as compared to a bused electrical center constructed in accordance with the prior art. In this regard, the bus bars 20 can be assembled to the bus bar housing 22; the interface terminals 28 can be received into the pockets 48 and arranged relative to the bus bars 20 such that the bus bar contacts 130 abut the isolation tabs 32; the filter housing 26 can be assembled to the bus bar housing 22; and the filter devices 24 can be installed such that the outer surface 54 of the capacitors 50 is abutted against the surface 88 of the filter cavity 80, the filter device retainers 84 secures the capacitors 50 to the filter housing 24, and the leads 52 extend through the lead apertures 82, through the guides 74 and into the lead recesses 45*a* of the alignment bosses 45 such that the leads 52 are received in the alignment bosses 45. It will be appreciated that if the edges 45*b* of the alignment bosses 45 that surround the lead recesses 45*a* are tapered or contoured, the edges 45*b* can help to guide the insertion portions 62 into the lead recesses 45*a*. Similarly, tapering or contouring of the outer edges 45*b* of the alignment bosses 45 can aid in the assembly of the terminal interfaces 28 into the pockets 48 (where the terminal interfaces 28 are installed over the alignment bosses 45). No solder need be employed to electrically or mechanically couple the interface terminals 28 to the leads 52 or to the isolation tabs 32 and as such, it will be understood that the interface terminals 28 are the sole means for electrically connecting the isolation tabs 32 and the leads 52.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A bused electrical center comprising:
 a pair of bus bars, each of the bus bars having an isolation tab;
 a bus bar housing having a first housing body, a plurality of first rails and a plurality of alignment bosses, the first rails extending from the first housing body, each of the alignment bosses being coupled to the first housing body and being disposed between a corresponding pair of the first rails, the bus bars being mounted on the bus bar housing such that each of the isolation tabs is disposed between an associated pair of the first rails;
 a filter housing having a second housing body, a plurality of second rails, and a plurality of guides, the second housing body defining a filter cavity and a pair of lead apertures, the second rails being coupled to the second housing body and being disposed parallel to the lead apertures, each of the lead apertures extending through an associated one of the guides, the second housing body being coupled to the first housing body such that the second rails engage the first rails;
 a filter device having a capacitor and a pair of leads that are electrically coupled to the capacitor, the capacitor being at least partly received in the filter cavity, each of the leads being received through an associated one of the lead apertures, an associated one of the guides and into an associated one of the alignment bosses; and
 a plurality of interface terminals, each of the interface terminals being received between a pair of the first rails and having a bus bar contact, which is electrically engaged to a corresponding one of the isolation tabs, and a lead contact that is electrically engaged to a corresponding one of the leads;
 wherein no solder is employed to electrically or mechanically couple the interface terminals to the leads or to the isolation tabs such that the interface terminals are the sole means for electrically connecting the isolation tabs and the leads.

2. The bused electrical center of claim 1, wherein each of the interface terminals comprises a spring contact that is compressed between the corresponding one of the isolation tabs and the corresponding one of the leads.

3. The bused electrical center of claim 2, wherein the spring contact extends from the bus bar contact and includes a generally U-shaped nose, which is engaged to the corresponding one of the leads, and a generally L-shaped foot, which is engaged to the corresponding one of the isolation tabs.

4. The bused electrical center of claim 1, wherein each of the leads has a contact zone that contacts the lead contact of an associated one of the interface terminals and wherein the contact zone and the lead contact are shaped such that contact therebetween occurs over a predetermined area.

5. The bused electrical center of claim 4, wherein the contact zones have a first flat surface that engages a flat surface formed on the lead contact.

6. The bused electrical center of claim 5, wherein a second flat surface is formed on each contact zone on a side opposite the first flat surface and wherein each of the interface terminals includes a spring arm that engages the second flat surface, the spring arm biasing the lead into abutment with the lead contact.

7. The bused electrical center of claim 1, wherein each of the leads has a leading end that is chamfered on four sides.

8. The bused electrical center of claim 1, wherein an end wall extends between and connects each adjacent pair of the first rails.

9. The bused electrical center of claim 1, wherein the bus bar housing further comprises a plurality of first retainers that are coupled to the first housing body, the first retainers being coupled to a plurality of second retainers that are coupled to the second housing body, wherein engagement of the first and second retainers to one another fixedly couples the bus bar housing to the filter housing.

10. The bused electrical center of claim 1, wherein each of the bus bars is nested into the first housing body of the bus bar housing.

11. The bused electrical center of claim 1, wherein the filter cavity is shaped to matingly engage a surface of the capacitor.

12. The bused electrical center of claim 1, wherein an entry aperture connects an associated one of the lead apertures to the filter cavity, the entry aperture intersecting the filter cavity and the associated one of the lead apertures, the entry aperture having sidewalls that are tapered in a manner that converges with increasing distance from the filter cavity.

13. The bused electrical center of claim 1, wherein the leads are formed of wire, wherein a first portion of the wire has a first cross-sectional shape, wherein a second portion of the wire has a second cross-sectional shape that is different from the first cross-sectional shape, wherein a contact zone is formed in at least a portion of the second portion of the wire, the contact zone contacting the lead contact of an associated one of the interface terminals.

14. The bused electrical center of claim 13, wherein the first cross-sectional shape has a first area, wherein the second cross-sectional shape has a second area, and wherein the second area is larger than the first area.

15. The bused electrical center of claim 1, wherein each of the leads has a contact zone that contacts the lead contact of an associated one of the interface terminals, and wherein each of the leads is formed of a conductive material, and wherein the conductive material in the contact zone is deformed in a coining operation.

16. A method for forming a bused electrical center, the method comprising:
providing a capacitor with a pair of leads;
assembling a plurality of bus bars to a bus bar housing, each of the bus bars having an isolation tab that extends into a pocket that is defined by a pair of first rails and an end wall that interconnects the pair of first rails;
installing an interface terminal to each of the isolation tabs, each interface terminal being received in an associated one of the pockets;
installing a filter housing to the bus bar housing; and
installing the capacitor to the filter housing such that each of the leads of the capacitor extends through the filter housing and an associated one of the interface terminals and into the bus bar housing to thereby couple each of the leads to the associated one of the interface terminals and a corresponding one of the isolation tabs.

17. The method of claim 16, further comprising deforming the leads to form an insertion tip and a contact zone on each of the leads, wherein the insertion tip is received into the bus bar housing and wherein the contact zone contacts the associated one of the interface terminals to electrically couple the lead to the associated one of the interface terminals.

18. The method of claim 17, wherein the leads are deformed in a coining operation.

* * * * *